US009880202B2

(12) United States Patent
Vettori et al.

(10) Patent No.: US 9,880,202 B2
(45) Date of Patent: Jan. 30, 2018

(54) PROBE CARD FOR AN APPARATUS FOR TESTING ELECTRONIC DEVICES

(71) Applicant: Technoprobe S.p.A., Cernusco Lombardone (IT)

(72) Inventors: Riccardo Vettori, Cernusco Lombardone (IT); Riccardo Liberini, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 373 days.

(21) Appl. No.: 14/528,774

(22) Filed: Oct. 30, 2014

(65) Prior Publication Data

US 2015/0048856 A1    Feb. 19, 2015

Related U.S. Application Data

(63) Continuation-in-part of application No. PCT/EP2013/001675, filed on Jun. 7, 2013.

(30) Foreign Application Priority Data

Jun. 8, 2012   (IT) .............................. MI2012A0996

(51) Int. Cl.
*G01R 31/01*     (2006.01)
*G01R 1/073*     (2006.01)
*G01R 31/28*     (2006.01)
*G01R 1/067*     (2006.01)

(52) U.S. Cl.
CPC ..... *G01R 1/07364* (2013.01); *G01R 1/06733* (2013.01); *G01R 1/07314* (2013.01); *G01R 1/07378* (2013.01); *G01R 31/2889* (2013.01)

(58) Field of Classification Search
CPC ............ G01R 1/07307; G01R 1/07342; G01R 1/06705; G01R 1/06788; G01R 31/2867; G01R 31/2893; G01R 1/0466; G01R 1/06794; G01R 1/07314; G01R 1/07364; G01R 31/01; G01R 31/028; G01R 31/2863; G01R 31/2889; G01R 31/02
See application file for complete search history.

(56) References Cited

U.S. PATENT DOCUMENTS

| | | | |
|---|---|---|---|
| 2007/0126440 A1* | 6/2007 | Hobbs ................ | G01R 31/2893 324/754.03 |
| 2009/0146675 A1* | 6/2009 | Karklin .............. | G01R 1/07364 324/762.01 |
| 2009/0261849 A1* | 10/2009 | McGlory ........... | G01R 1/07342 324/756.03 |
| 2010/0000080 A1 | 1/2010 | Elridge et al. | |
| 2010/0102837 A1 | 4/2010 | Abe et al. | |
| 2010/0134129 A1 | 6/2010 | Breinlinger et al. | |

\* cited by examiner

*Primary Examiner* — Tung X Nguyen
(74) *Attorney, Agent, or Firm* — Seed IP Law Group LLP (57) ABSTRACT

A probe card for an apparatus for testing electronic devices comprises at least one probe head, a plurality of contact probes housed within the probe head, each contact probe having at least one contact tip suitable to abut against contact pads of a device to be tested, a supporting plate of the probe head, an interface plate, a stiffener associating the supporting plate and the interface plate, a plurality of connecting elements with clearance disposed between the supporting plate and the interface plate and housed in a floating manner in a plurality of respective seats made in the supporting plate, and a plurality of connecting elements without clearance disposed between the interface plate and the stiffener.

34 Claims, 6 Drawing Sheets

PROBE CARD FOR AN APPARATUS FOR TESTING ELECTRONIC DEVICES

FIELD OF THE INVENTION

The present disclosure refers to a probe card for an apparatus for testing electronic devices.

BACKGROUND OF THE INVENTION

As it is well known, a probe card is essentially a device adapted to electrically connect a plurality of contact pads of a microstructure, in particular an electronic device integrated on wafer, with corresponding channels of a test apparatus that performs the functionality verification, in particular electrical, or generally tests it.

The test performed on integrated devices in particular serves to detect and isolate faulty devices already at the manufacturing stage. Usually, the probe cards are thus used for electrically testing devices integrated on wafer before cutting or singling out the same and before the assembly thereof within a package for containing chips.

A probe card comprises a probe head in turn essentially including a plurality of mobile contacting elements or contact probes provided with at least one contact portion or tip for a corresponding plurality of contact pads of a device to be tested. The terms end or tip are hereinafter used to indicate an end portion, not necessarily sharply pointed.

Thus, it is known that the effectiveness and reliability of a measurement test depends, among other factors, also on the obtainment of a good electric connection between the device and the test apparatus, thus, on an ideal electrical probe/pad contact.

The types of probe heads which are widely used in the technical field considered herein for testing integrated circuits include the so-called probe heads having cantilevered probes, also referred to as cantilever probe heads, which have probes protruding like a fishing rod over a device to be tested.

In particular, a cantilever probe head of the known type usually supports a plurality of flexible, generally wire-like probes, with preset electrical and mechanical properties. The probes, cantilevered projecting from the cantilever probe head, are substantially shaped to form a hook, due to the presence of a substantially elbow bended terminal portion having a generally obtuse internal angle.

The good connection between the probes of a cantilever probe head and the contact pads of a device to be tested is due to the pressure of the probe head on the device itself, the probes being subjected thereby to a vertical flexion (with respect to the plane defined by the device to be tested) in the opposite direction with respect to the movement of the device towards the probe head.

The hooked shape of the probe is such that, during the contact with the contact pads of the device to be tested and the displacement of the probes upwards beyond a pre-established contact point, usually referred to as "overtravel", the points of contact of the probe slide on the contact pads over a length commonly referred to as "scrub".

Also known in the field are the probe heads having vertical probes and referred to by the term "vertical probe heads". A vertical probe head essentially comprises a plurality of contact probes held by at least one pair of plates or guides substantially plate-like and parallel to each other. Such guides are provided with special holes and they are arranged at a given distance with respect to each other so as to leave a free zone or air gap for the movement and possibly deformation of the contact probes. In particular the pair of guides comprises an upper guide or die and a lower guide or die, both provided with guide holes within which the contact probes axially slide, usually made of special alloy wires with good electrical and mechanical properties.

The good connection between the contact probes and the contact pads of the device being tested is also in this case due to the pressure of the probe head on the device itself, the contact probes, movable within the guide holes made in the upper and lower guides, being subjected to a flexion during such pressure contact within the air area between the two guides, and to a sliding within such hole guides.

Furthermore, the flexion of the contact probes in the air gap may be assisted through a suitable configuration of the probes or of the guide thereof, in particular using pre-deformed contact probes or suitably shifting the plates that comprise them.

Figure 1A:
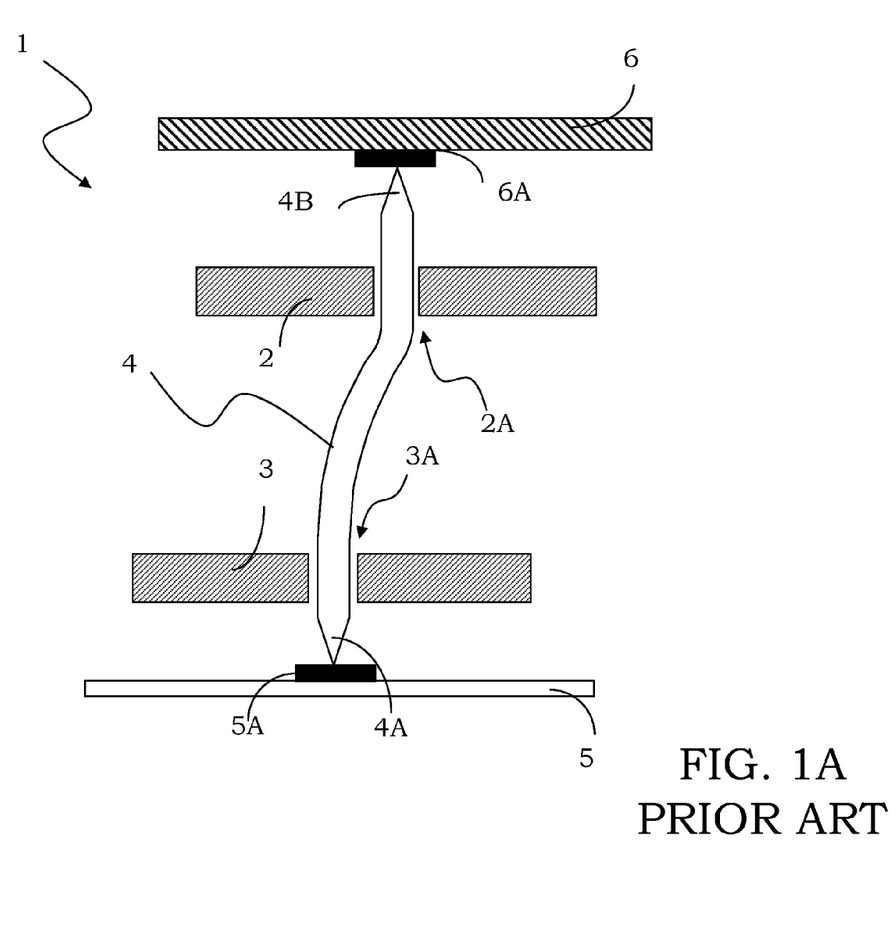
FIG. 1A schematically shows a contact probe for a vertical probe head obtained according to the prior art.

FIG. 1A schematically illustrates a probe head 1 comprising at least one upper plate or guide 2 and a lower plate or guide 3, having respective upper guide holes 2A and lower guide holes 3A within which there slides at least one contact probe 4.

The contact probe 4 has at least one end or contact tip 4A. In particular the contact tip 4A abuts on a contact pad 5A of a device 5 to be tested, performing the mechanical and electrical contact between said device and a test apparatus (not represented) regarding which the probe head forms an end element.

Generally, there are used probe heads with probes not fixedly constrained, but kept interfaced with a board, in turn connected to the test apparatus: this is the case of non-locked contact probes.

In this case, as illustrated in FIG. 1A, the contact probe 4 has a further contact tip 4B, in practice indicated as contact head, towards a plurality of contact pads 6A of the board 6. The good electrical contact between probes and the board is analogously due to the contact with the device to be tested by pressing the probes on the contact pads of the board.

In addition, the board 6 is held in position by means of a stiffener 8. The assembly of the probe head, the board and the stiffener forms a probe card, indicated in its entirety with 10 in FIG. 1B.

Thus, in the vertical probe technology it is also important to guarantee the good connection of the contact probes with the testing apparatus, in particular in correspondence of the contact heads thereof and thus of the board.

Figure 1B:
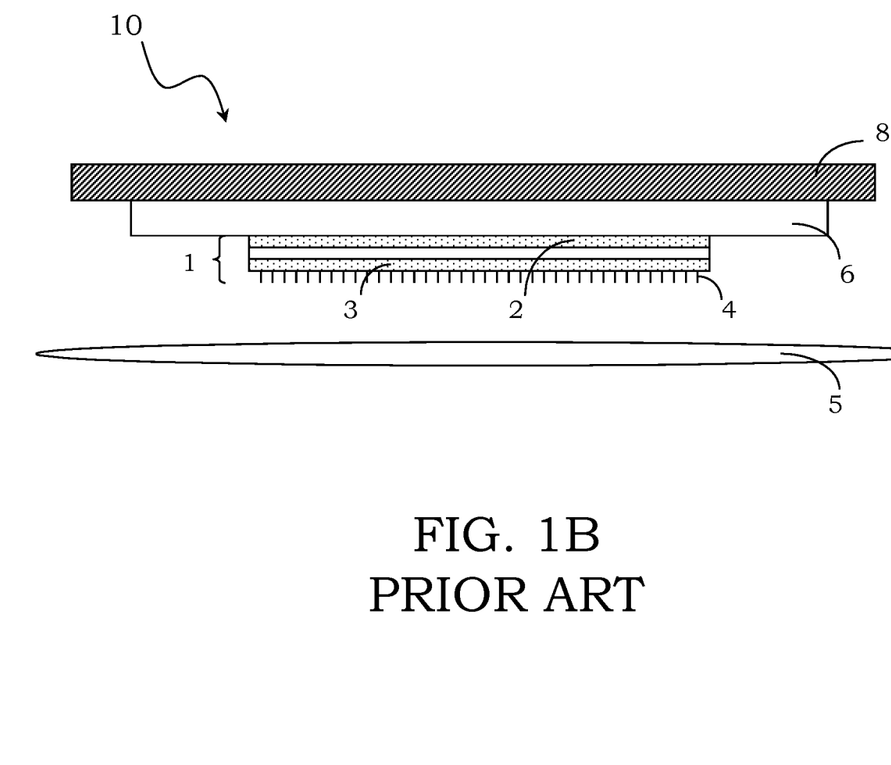
FIG. 1B schematically shows a probe card adapted to support a vertical probe head obtained according to the prior art.

Another critical parameter in the production of a probe head is the distance (the so-called pitch) between the centres of the contact pads on the device to be tested. The pitch of the integrated electronic devices has become smaller and smaller as the corresponding manufacturing technology has been progressing, leading to a high packing of the contact probes 4 in the probe head 1, with the ensuing problems regarding positioning to avoid the mutual contact thereof. Such distance restrictions are slightly less strict instead as regards the contact pads on the board 6, given that such pads are suitable to be spaced further apart and arranged more freely, in particular in a more orderly manner, compared to those of the device to be tested.

There are known various technologies for obtaining the probe card 10 of the testing apparatus.

In particular, a first solution exploits the techniques of the printed circuits for obtaining the card 10, which is also commonly referred to as PCB. This technology allows obtaining cards with active areas even of large dimensions, but with major restrictions with respect to a minimum value that can be attained for the pitch in conditions of high density of the contact pads on the device to be tested.

Also known is the ceramic based technology or MLC (Multilayer Ceramic). This technology allows attaining extremely small pitches and much higher densities compared to the PCB technology, but it entails limitations regarding the maximum number of signals that can be used for the test and on the maximum dimension of the active area that can be accommodated on the card.

Lastly, there can be used the so-called hybrid technology in which the probe card is interfaced with an intermediate plate, commonly indicated as interposer, in turn connected to a mechanical support, commonly indicated as a plug and connected by means of welding bridges to the card. This technology offers considerable flexibility in terms of surface, pitch and signal density, but it is limited as regards the maximum number of signals that can be treated, also revealing poorer electromagnetic performance. Last but not least, the difficult automation capacity thereof also represents a disadvantage of the hybrid technology.

The mutual positioning of the elements forming the card is also a key parameter. In particular, various test methods need that the probe card be capable of withstanding high temperatures. However, in such case the thermal expansions of such elements that form the probe card may hinder the correct working thereof. Actually, the elements that form the probe cards of the known type are usually fastened by means of screws. Thus, during testing under high temperatures, due to the various coefficients of thermal expansion of the materials such elements are made of and the fastening obtained by the screws, the elements tend to arc, causing the malfunctioning of the probe card as a whole, even leading to lack of contact with the contact pads of the device to be tested.

SUMMARY OF THE INVENTION

The present disclosure relates to a probe card adapted to support a probe head provided with a plurality of contact probes for the connection with an apparatus for testing electronic devices, in particular integrated on wafers.

One or more embodiments of the present disclosure invention overcomes the several problems identified above affecting the probe cards obtained through the known technologies, so as to in particular allow to manage the test at high temperature.

In one embodiment the probe head is associated—in a floating manner—with a stiffener, so as to compensate the dimensional variations related to the thermal expansions that the elements that form the probe card are subjected to during the testing step and eliminate the possibility of deformation, in particular the bending, of the elements of the probe card coupled mechanically but made with materials having various coefficients of thermal expansion, in particular a supporting plate and an interface plate of the card itself.

The probe card for an apparatus for testing electronic devices may comprise
 at least one probe head,
 a plurality of contact probes housed within the probe head, each contact probe having at least one contact tip suitable to abut against contact pads of a device to be tested,
 a supporting plate of the probe head,
 an interface plate,
 a stiffener associating the supporting plate and the interface plate,
 a plurality of connecting elements with clearance disposed between the supporting plate and the interface plate and housed in a floating manner in a plurality of respective seats made in the supporting plate, and
 a plurality of connecting elements without clearance disposed between the interface plate and the stiffener.

Other embodiments may of the probe card according to the disclosure may comprise the following additional and optional features, considered separately or combined if needed.

According to an aspect of the disclosure, each connecting element with clearance of the plurality of connecting elements with clearance may comprise a body and a head portion connected to each other, the head portion having at least one transverse dimension greater than a transverse dimension of the body so as to form a shoulder in a conformation with a substantially T-section and a corresponding seat of the plurality of respective seats may have a configuration corresponding and mating with that of the connecting element with clearance in a conformation with a substantially T-section and respective larger dimensions to allow the floating housing of the connecting element with clearance.

According to this aspect of the disclosure, each seat of the plurality of respective seats may comprise a body and a head portion connected to each other, the head portion having at least one transverse dimension greater than a transverse dimension of the body so as to form a shoulder adapted to abut against the shoulder of a corresponding connecting element with clearance of the plurality of connecting elements with clearance.

In addition, according to an aspect of the disclosure, at least one connecting element with clearance of the plurality of connecting elements with clearance and at least one corresponding seat of the plurality of respective seats may have substantially tubular bodies and head portions.

In particular, according to this aspect of the disclosure, such at least one connecting element with clearance and at least one corresponding seat may have respective bodies with diameter comprised between 3 mm and 5 mm and respective head portions with a diameter comprised between 5 mm and 10 mm.

According to another aspect of the disclosure, each seat of the plurality of respective seats may comprise a body and a head portion having larger dimensions of at least 10% compared to corresponding dimensions of a body and a head portion of a corresponding connecting element with clearance of the plurality of connecting elements with clearance housed floating in it.

According to this aspect of the disclosure, between the bodies of each connecting element with clearance and the respective seat there may be defined a first clearance, between the head portions of the connecting element with clearance and the respective seat there may be defined a second clearance and between the shoulders of the connecting element with clearance and the respective seat there may be defined a third clearance.

In particular, the first, second and third clearance may have values comprised between 50 μm and 350 μm, preferably 100 μm.

According to another aspect of the disclosure, the first clearance may substantially have a zero value in the transverse direction and there may be defined a further clearance between the head portions of the connecting element with clearance and a respective seat at a face of the supporting plate facing a support of the probe card as a whole, such further clearance having a greater value than the third clearance.

According to this aspect of the disclosure, a space of predetermined thickness may be defined between the interface plate and a further face of the supporting plate.

Furthermore, according to an aspect of the disclosure, the connecting elements with clearance of the plurality of connecting elements with clearance may be arranged according to radially disposed alignment directions and they may have—with the corresponding seats of the plurality of respective seats—a positive clearance only according to the alignment directions, a substantially zero clearance being established in the radial direction.

According to this aspect of the disclosure, the plurality of connecting elements with clearance may comprise at least three connecting elements with clearance arranged with alignment directions forming an angle of 60° between them.

Still according to this aspect of the disclosure, the connecting elements with clearance may have a substantially circular section of predetermined diameter and the corresponding seats may have an elongated section with smaller dimensions corresponding to the predetermined diameter and larger dimension corresponding to the sum of the predetermined diameter and twice the clearance.

In addition, according to another aspect of the disclosure, the interface plate may comprise contact portions with the supporting plate by means of at least one connecting elements with clearance of the plurality of connecting elements with clearance.

According to this aspect of the disclosure, the interface plate may comprise further contact portions with the stiffener by means of at least one connecting element without clearance of the plurality of connecting elements without clearance.

Furthermore, the probe card may comprise connecting elements without clearance between the probe head and the stiffener.

According to another aspect of the disclosure, the interface plate may comprise first discrete contact portions with the supporting plate by means of the connecting elements with clearance.

According to this aspect of the disclosure, the interface plate may comprise second contact portions with the stiffener and with the first contact portions by means of respective connecting elements without clearance of the plurality of connecting elements without clearance.

Furthermore, the interface plate may comprise a further contact portion between the probe head and the stiffener by means of respective further connecting elements without clearance of the plurality of further connecting elements without clearance.

According to an aspect of the disclosure, the connecting elements with clearance may be made with a material having a low coefficient of thermal expansion compared to a material that realizes the supporting plate.

Lastly, the connecting elements with clearance may be made of steel.

The present disclosure also relates to a probe card apparatus comprising:

at least one probe head housing a plurality of contact probes, each contact probe having at least one contact tip suitable to abut against contact pads of a device to be tested, a supporting plate of the probe head, an interface plate, a stiffener associating the supporting plate and the interface plate, a plurality of connecting elements with clearance disposed between the supporting plate and the interface plate and housed in a floating manner in a plurality of respective seats made in the supporting plate, and a plurality of connecting elements without clearance disposed between the interface plate and the stiffener, the connecting elements with clearance being made with a material having a low coefficient of thermal expansion compared to a material that realizes the supporting plate.

According to an aspect of the disclosure, each connecting element with clearance may comprise: a body and a head portion connected to each other, the head portion having at least one transverse dimension greater than a transverse dimension of the body so as to form a shoulder in a conformation with a substantially T-section, and a corresponding seat has a configuration corresponding and mating with that of the connecting element with clearance in a conformation with a substantially T-section and respective larger dimensions to allow the housing in a floating manner of the connecting element with clearance.

The probe card apparatus may also comprise: a first clearance is defined between the bodies of the connecting element with clearance and the respective seat, a second clearance is defined between the head portions of the connecting element with clearance and the respective seat, and a third clearance is defined between the shoulders of the connecting element with clearance and the respective seat.

More particularly, the first clearance may have a substantially zero value in the transverse direction and a further clearance is defined between the head portions of the connecting element with clearance and a respective seat in correspondence of a face of the supporting plate facing a support of the probe card as a whole, the further clearance having a greater value than the third clearance.

Moreover, the connecting elements with clearance may be arranged according to radially disposed alignment directions, and have a positive clearance with the corresponding seats only along the alignment directions, a substantially zero clearance being established in the radial direction.

According to another aspect of the disclosure, the interface plate may comprise first discrete contact portions with the supporting plate through the connecting elements with clearance.

Moreover, the interface plate may comprise a further contact portion between the probe head and the stiffener through respective connecting elements without clearance.

According to yet another aspect of the disclosure, the head portions of the connecting elements with clearance may protrude from the supporting plate so as to go in direct contact against a support on which the probe card is positioned.

Finally, the present disclosure relates to a testing apparatus comprising:

a device to be tested having a plurality of contact pads, a probe head housing a plurality of contact probes having respective contact tips suitable to abut against the contact pads of the device to be tested, a supporting plate of the probe head associated to an interface plate by means of a stiffener, a plurality of connecting elements with clearance disposed between the supporting plate and the interface plate and housed in a floating manner in a plurality of respective seats made in the supporting plate, and a plurality of connecting elements without clearance disposed between the interface plate and the stiffener.

According to an aspect of the disclosure, each connecting element with clearance may comprise: a body and a head portion connected to each other, the head portion having at least one transverse dimension greater than a transverse dimension of the body so as to form a shoulder in a conformation with a substantially T-section, and a corresponding seat has a configuration corresponding and mating with that of the connecting element with clearance in a conformation with a substantially T-section and respective larger dimensions to allow the housing in a floating manner of the connecting element with clearance.

Moreover, a first clearance may defined between the bodies of the connecting element with clearance and the respective seat, a second clearance may be defined between the head portions of the connecting element with clearance and the respective seat, and a third clearance may be defined between the shoulders of the connecting element with clearance and the respective seat.

In particular, the first clearance may have a substantially zero value in the transverse direction and a further clearance may be defined between the head portions of the connecting element with clearance and a respective seat in correspondence of a face of the supporting plate facing a support of the probe card as a whole, the further clearance having a greater value than the third clearance.

According to another aspect of the disclosure, the connecting elements with clearance may be arranged according to radially disposed alignment directions, and may have a positive clearance with the corresponding seats only along the alignment directions, a substantially zero clearance being established in the radial direction.

Moreover, according to yet another aspect of the disclosure, the interface plate may comprise contact portions with the supporting plate through at least one connecting element with clearance.

In particular, the interface plate may include further contact portions with the stiffener through at least one connecting element without clearance.

According to another aspect of the disclosure, the interface plate may comprise first discrete contact portions with the supporting plate through the connecting elements with clearance.

More particularly, the interface plate may comprise a further contact portion between the probe head and the stiffener through respective connecting elements without clearance.

According to a further aspect of the disclosure, the connecting elements with clearance may be made with a material having a low coefficient of thermal expansion compared to a material that realizes the supporting plate.

Finally, the head portions of the connecting elements with clearance may protrude from the supporting plate so as to go in direct contact against a support on which the probe card is positioned.

The characteristics and advantages of the probe card according to the disclosure shall be apparent from the description, provided for hereinafter, of an embodiment thereof provided by way of non-limiting example with reference to the attached drawings.

DETAILED DESCRIPTION

Figure 2:
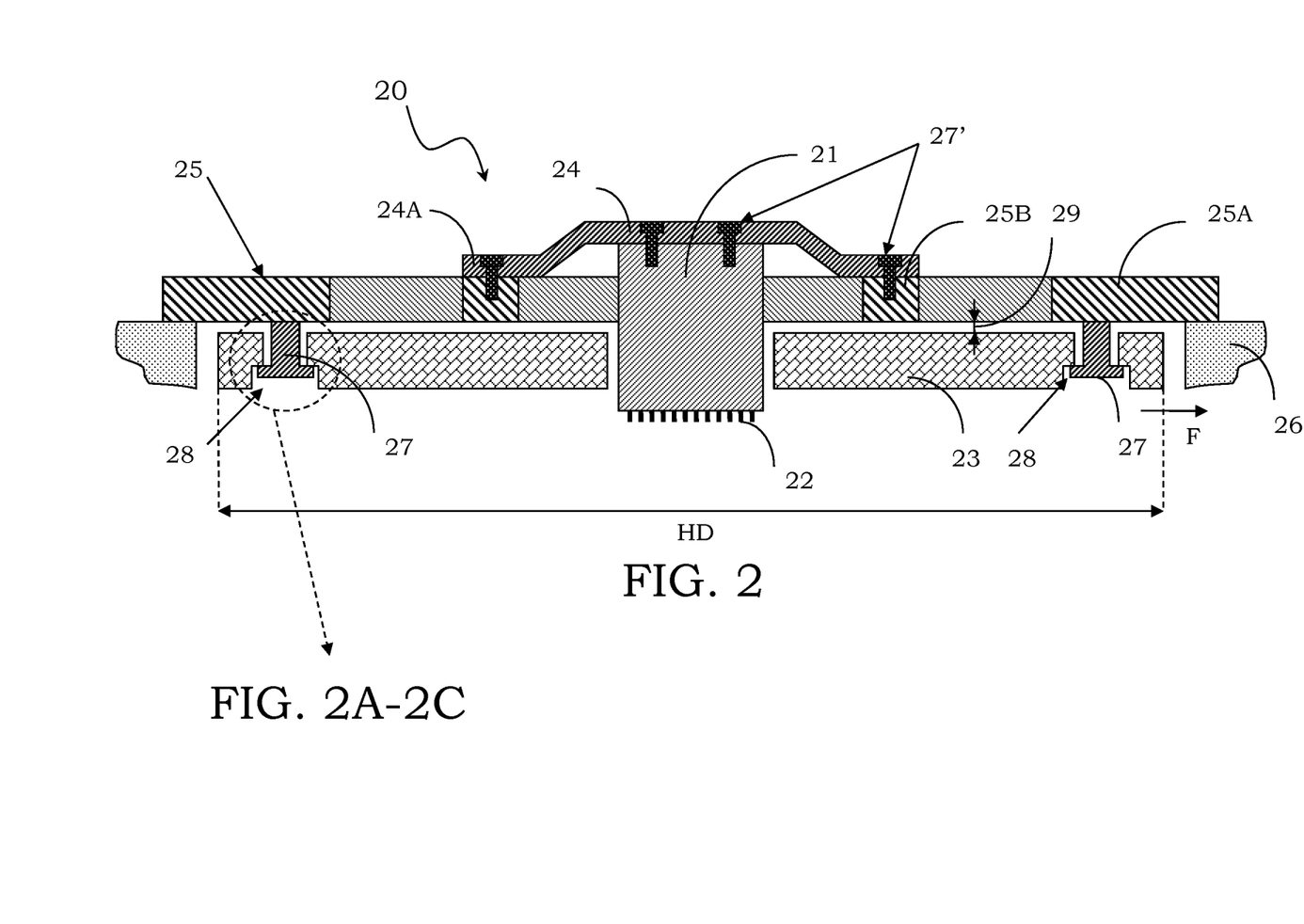
FIG. 2 schematically shows a probe card according to an embodiment of the disclosure.

With reference to such figures, and in particular to FIG. 2, a probe card comprising at least one probe head provided with a plurality of contact probes for testing electronic devices, in particular integrated on a wafer, is indicated with 20 as a whole.

It should be observed that the figures represent schematic views of the system according to the disclosure and they were not drawn in scale, but in a way to highlight the major features of the disclosure.

In addition, the various aspects of the disclosure represented by way of example in the figures can obviously be combined with each other and be interchanged from one embodiment to the other.

In particular, as illustrated in FIG. 2, the probe card 20 comprises a probe head 21 which houses a plurality of contact probes 22, as well as a supporting element, in particular a supporting plate 23, commonly referred to as PCB, associated through an interface element, in particular an interface plate 25, to a stiffener 24 and adapted to be connected with a test apparatus (not shown). In particular, in the example illustrated in the figure, the probe head 21 is of the vertical type and comprises at least one upper plate or guide and one lower plate or guide, having respective holes within which there slide contact probes 22 solely by way of example. There can also be used a probe head of the cantilever type, the disclosure not being limited to a particular type of probe head.

In any case, the contact probes 22 comprise contact ends or tips adapted to abut against corresponding contacting pads of a device to be tested so as to obtain the desired contact, in particular an electrical contact, between the contact pad and the probe card 20, and thus the test apparatus connected thereto.

Generally, the devices to be tested are circuits integrated on a wafer made of a semiconductor material which—during the test stage—is arranged on a support 26, commonly referred to as card tray and part of a system usually referred to as a prober, on which also the probe card 20 abuts.

Advantageously, according to the disclosure, the probe card 20 also comprises at least one connecting element 27 between the supporting plate 23 and the interface plate 25, such connecting element 27 being housed with clearance in a suitable seat 28 obtained in the supporting plate 23. Further connecting elements 27' without clearance are provided between the interface plate 25 and the stiffener 24 and between the probe head 21 and the stiffener 24.

In particular, the probe card 20 is provided with a plurality of connecting elements 27 with clearance in connection with contact portions 25A of the interface plate 25, the same having further contact portions 25B with the stiffener 24, suitably provided with lateral arms 24A which connect it to such further contact portions 25B of the interface plate 25 indeed.

Figure 2A:
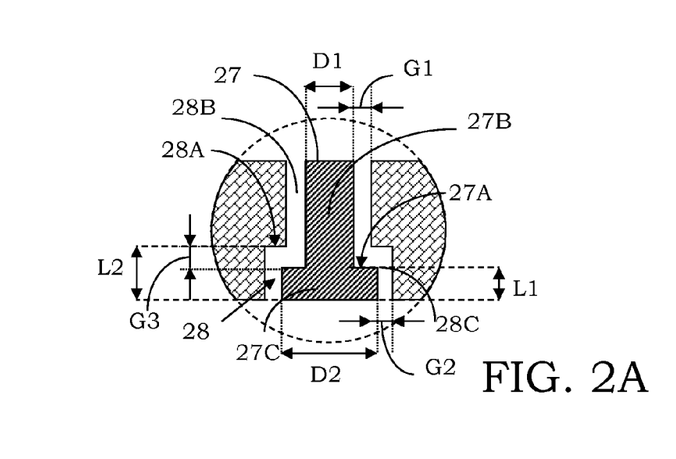
FIGS. 2A-2C schematically show enlargements of a connecting element of the probe card of FIG. 2 in various working conditions.

More in particular, the connecting element 27 with clearance comprises a body 27B and a head portion 27C connected to the body 27B and having at least one transverse dimension larger than the transverse dimension of the body 27B so that the connecting element 27 with clearance is provided with suitable shoulders 27A adapted to go in abutment with corresponding shoulders 28A of the seat 28, as illustrated further in detail but still schematically in the enlargement of FIG. 2A in inoperative conditions, i.e. in absence of mechanical stresses and/or thermal expansions thereof. Suitably, as illustrated in such figure, the seat 28 shall have a configuration corresponding and matching with that of the connecting element 27 with clearance and respective larger dimensions to allow the housing of the connecting element 27 with clearance therein in a floating manner. Furthermore, at least one portion of the body of the connecting element 27 with clearance may penetrate into the interface plate 25 and be made integral therewith, in particular at the corresponding contact portion 25A, to obtain the desired integration between the connecting element 27 with clearance and the interface plate 25 indeed. It should be observed that in a transverse section, like the one shown in FIGS. 2A-2C, the connecting elements 27 with clearance and the respective seats 28 have a capsized T-shape.

In case of substantially tubular elements, it can be provided for that the body 27B has a diameter D1 comprised between 3 mm and 5 mm and the head portion 27C has a diameter D2 comprised between 5 mm and 10 mm, such values being deemed in inoperative conditions of the probe card 20, i.e. in absence of mechanical stresses and/or thermal expansions thereof.

Advantageously, the seat 28 has elements, in particular the body 28B and the head portion 28C, corresponding to elements of the connecting element 27 with clearance, in particular the body 27B and the head portion 27C, respectively, with dimensions being enlarged by at least 10%, thus allowing the supporting plate 23 to expand following the increasing of the working temperature of the probe card 20, simultaneously avoiding any movement of the probe head 21, which would affect the good result of the test carried out therewith.

In particular, the seat 28 comprises tubular elements for which the diameters and thicknesses of the bodies 28B and head portion 28C are enlarged with respect to the corresponding diameters and thicknesses of the bodies 27B and head portions 27C of the connecting element 27 with clearance.

Thus, the connecting element 27 with clearance housed in the seat 28 has a first clearance G1 at its body 27B with respect to the body 28B of the seat 28, a second clearance G2 at its head portion 27C with respect to the head portion 28C of the seat 28 and a third clearance G3 at its shoulder 27A with respect to the shoulder 28A of the seat 28. Suitable values of these clearances G1, G2 and G3 are between 50 µm and 350 µm, preferably 100 µm; furthermore the values of such clearances G1, G2 and G3 may be identical or different with respect to each other according to needs. Obviously, the values of the clearances G1, G2 and G3 shall depend on the applications of the probe card 20.

Figure 2B:
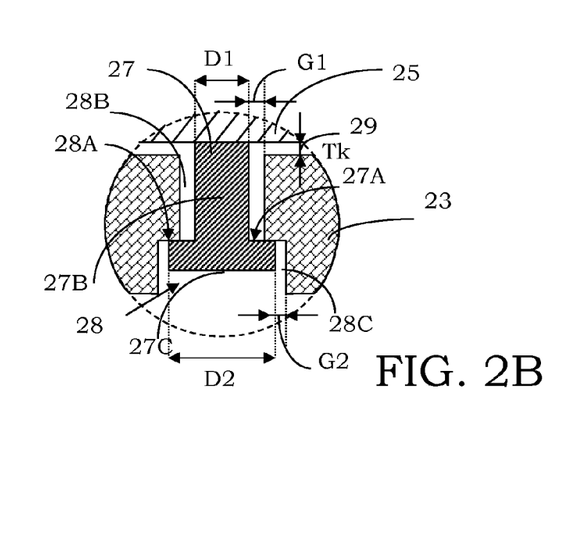

During the working, when the interface plate 25 is placed on the support 26, the shoulder 27A of the connecting element 27 with clearance is pressed against the shoulder 28A of the seat 28, as schematically illustrated in the enlargement of FIG. 2B. In this case, the third clearance G3 becomes null and a space 29 of thickness Tk having dimensions identical to the third clearance G3 is established between the supporting plate 23 and the interface plate 25, as also indicated in FIG. 2. The thickness Tk of the space 29 is determined by the suitable dimensioning of the connecting elements 27 with clearance, and in particular the head portion 27C thereof, having a thickness L1 smaller than the thickness L2 of the head portion 28C of the respective seats 28. More particularly, the thickness L1 is 10% smaller than the thickness L2. Also in this case, the values of the thicknesses L1 and L2 shall depend on the applications of the probe card 20.

Concretely, the supporting plate 23 is connected to the interface plate 25 in a floating manner due to the presence of the connecting elements 27 with clearance housing elements in the respective seats 28 in a floating manner.

Thus, in working conditions which imply temperatures that cause a thermal expansion of the materials that the elements of the probe card 20 are made of, the supporting plate 23 may expand, for example according to the direction indicated by the arrow F in FIG. 2. Advantageously, according to the disclosure, the use of the connecting elements 27 with clearance which allow connecting—with clearance—the supporting plate 23 with the interface plate 25, allows the supporting plate 23 to deform according to such thermal expansion without affecting the positioning of the probe head 21 within the probe card 20 and thus the correct working of the card itself. In addition, even a possible thermal expansion of the interface plate 25 does not affect the positioning of the supporting plate 23 which is not fixedly constrained to the interface plate 25, in particular preventing the bending of such supporting plate 23 and thus a displacement of the probe head 21, overcoming the drawbacks of the cards obtained according to the prior art. It should also be observed that any bending of the supporting plate 23, caused by the presence of a gradient temperature therein, due to the different temperatures of the wafer and the test apparatus surrounding it, is compensated by the coupling in a floating manner as obtained by the connecting elements 27 with clearance, thus reducing the risks of breaking the supporting plate 23 itself.

In particular, the presence of the space 29 allows eliminating the risk of breaking the supporting plate 23 due to its bending for a gradient temperature therein.

Figure 2C:
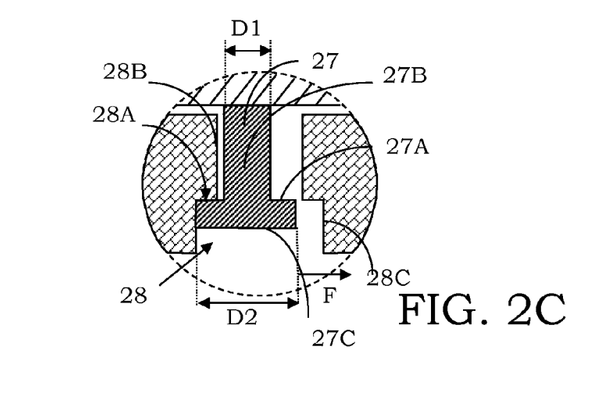

The mechanism related to the clearance between every connecting element 27 with clearance and the respective seat 28 is schematically illustrated in the enlargement of FIG. 2C, where it is clear that the connecting element 27 with clearance remains correctly housed in the seat 28 thereof even in the presence of thermal expansion of the supporting plate 23 where such seat 28 is obtained, such thermal expansion being indicated by an arrow F also in FIG. 2C.

Suitably, the connecting elements 27 with clearance are made using a material having a low coefficient of thermal expansion with respect to the material the supporting plate 23 is made of More particularly, in a preferred embodiment, the supporting plate 23 is made using a material suitable for manufacturing printed circuits, such as FR4 (acronym for "Flame Retardant") while the connecting elements 27 with clearance are made of steel, the variations of the dimensions thereof, in particular the diameters D1 and D2, being thus negligible with respect to the expansion of the supporting plate 23. Furthermore, the contact portions 25A of the interface plate 25 and the stiffener 24 may be made of a same material, in particular steel, so as to reduce movement in case of high temperature applications and, anyway, when there is a temperature able to produce a thermal expansion of the supporting plate 23 as a whole.

The assembly made up of the supporting plate 23 and the probe head 21 is particularly housed in a suitable hole of the prober system, having dimensions at least equivalent to the length HD indicated in FIG. 2, such length HD depending on the tester apparatus associated to the probe card 20.

Figure 3:
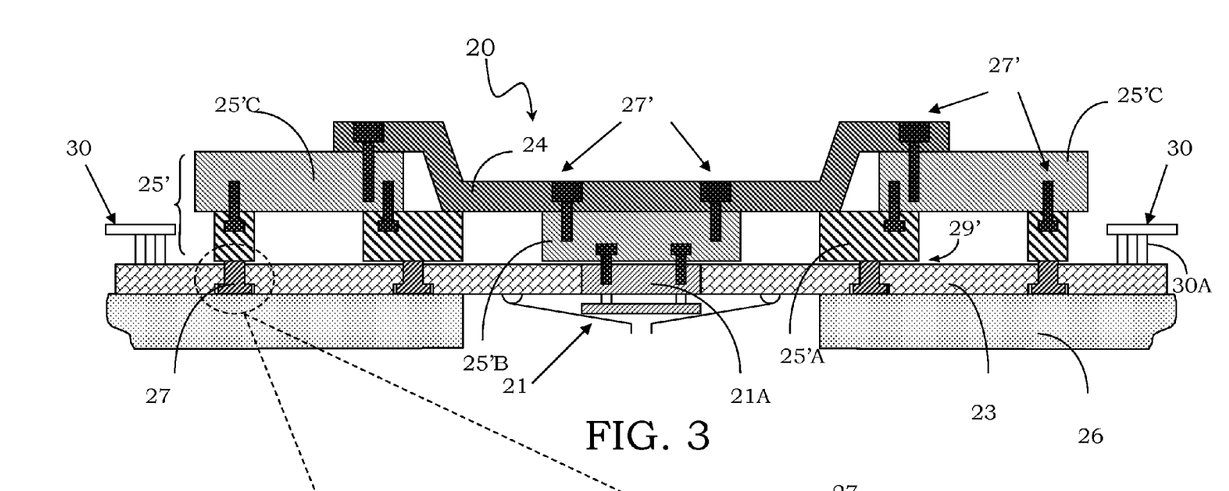
FIG. 3 schematically shows a probe card according to an alternative embodiment of the disclosure.

According to an alternative embodiment of the disclosure, schematically illustrated in FIG. 3, the probe card 20 is provided with a plurality of connecting elements 27 with clearance housed in a floating manner in respective seats 28 realised in the supporting plate 23.

Figure 3A:
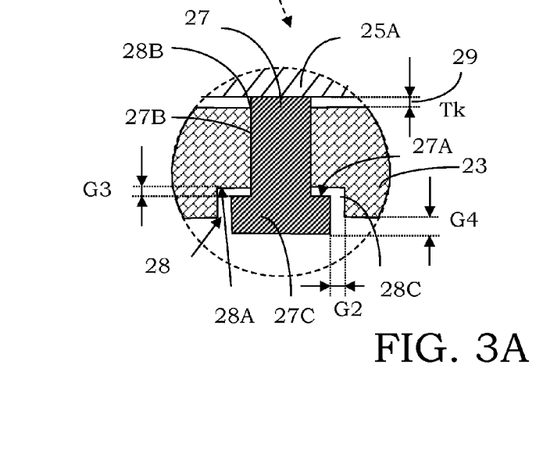
FIGS. 3A-3B schematically show enlargements of a connecting element of the probe card of FIG. 3 in various working conditions.

As shown further in detail in FIG. 3A, each connecting element 27 with clearance comprises a body 27B and a head portion 27C, the respective seat 28 being dimensioned so as to respectively have a body 28B with dimensions substantially corresponding to the body 27B of the connecting element 27 with clearance housed therein and a head portion 27C having larger dimensions, allowing, like in the previous embodiment, a floating housing of the connecting elements 27 with clearance in the respective seats 28. With respect to the previous embodiment, the first clearance G1 in correspondence of the bodies 27B and 28B is substantially null in the transverse direction while the second clearance G2 in correspondence of the head portions 27C and 28C and the third clearance G3 in correspondence of the shoulders 27A and 28A are still present. Furthermore, the head portion 27C of the connecting elements 27 with clearance is realized in such a way to establish a further clearance G4 with respect to a face of the supporting plate 23.

Such further clearance G4 is determined by the suitable combined dimensioning of the connecting elements 27 with clearance and the respective seats 28. In particular, the sum between the thickness of the head portion 27C of the connecting elements 27 with clearance and the third clearance G3 is greater than the thickness of the head portion 28C of the respective seats 28. The further clearance G4 is thus greater than the third clearance G3.

Figure 3B:
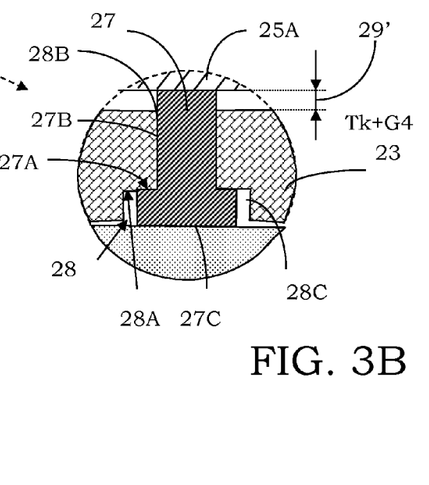

Thus, having positioned the probe card 20 on the support 26, the head portions 27C of the connecting elements 27 with clearance, that project from the supporting plate 23, end up in direct contact and pressing contact against the support 26, as illustrated in FIG. 3B.

Furthermore, there is a space 29 having a thickness Tk between the supporting plate 23 and a contact portion 25A of the interface plate 25 in correspondence of the respective contact element 27 with clearance, as also indicated in FIG. 3. The thickness Tk of the space 29 is determined by the suitable dimensioning of the connecting elements 27 with clearance, and in particular the head portion 27C thereof, which has a thickness L1 greater than the thickness L2 of the head portion 28C of the respective seats 28. More in particular, the thickness L1 is 10% greater than the thickness L2. Also in this case, the values of the thicknesses L1 and L2 shall depend on the applications of the probe card 20.

It should be observed that the configuration of the connecting elements 27 with clearance and of the respective seats 28 shown in FIGS. 3A and 3B, as well as the presence of the space 29 between the supporting plate 23 and the interface plate 25 in inoperative conditions may also be used for the probe card 20 illustrated in FIG. 2.

According to the embodiment illustrated in FIG. 3, the interface plate 25' particularly comprises a plurality of first contact portions 25'A with corresponding connecting elements 27 with clearance. With respect to the previous embodiment, the first contact portions 25'A may be, in this case, discrete or separate portions, instead of portions of a layer the actual interface plate is made of.

Furthermore, the interface plate 25' comprises a further contact portion 25'B between the probe head 21, in particular between a portion 21A thereof, commonly referred to as spacer, incorporated in the supporting plate 23, and the stiffener 24, as well as a plurality of second contact portions 25'C between the contact portions 25A with the connecting elements 27 with clearance and the stiffener 24, even such second contact portions 25'C possibly being discrete or separate portions.

A plurality of further connecting elements 27' without clearance are provided between the probe head 21 and the interface plate 25', as well as between the interface plate 25' and the stiffener 24. In particular, the further connecting elements 27' without clearance connect the contact portion 25'B and the probe head 21, the further contact portions 25'C and the contact portions 25'A, as well as the further contact portions 25'C and the stiffener 24. The further connecting elements 27' without clearance may be obtained by means of simple screws.

Thus, the entire mechanism of the probe card 20 is substantially raised due to the further connecting elements 27' without clearance.

The correct positioning of the probe card 20 illustrated in FIG. 3 may be guaranteed by a suitable positioning of the connecting elements 27 and of the respective seats 28.

Figure 4:
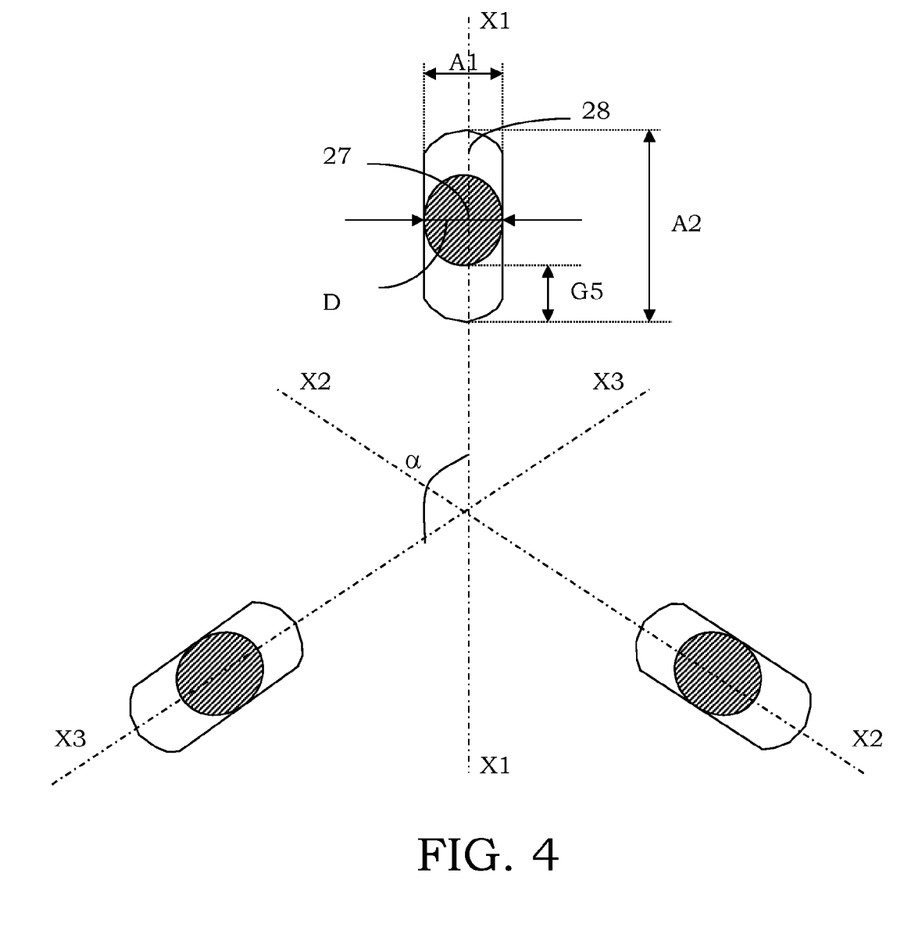
FIG. 4 schematically shows an arrangement for the connecting elements of FIGS. 3A-3B.

According to an aspect of the disclosure, as schematically illustrated in FIG. 4, the supporting plate 23 comprises at least three connecting elements 27 with clearance arranged in a plane π defined by the supporting plate 23 so that the aligning directions X1-X1, X2-X2, X3-X3 of the connecting elements 27 with clearance form an angle α of 120° therebetween. Generally, such angle α is equivalent to 360°/number of elements.

Thus, it should be observed that the corresponding seats 28 have a clearance G5, positive and radial, only along such aligning directions X1-X1, X2-X2, X3-X3, while they have a substantially null clearance in the transverse direction, so as to allow an expansion of the supporting plate 23 but simultaneously guaranteeing the correct positioning of the same.

More in particular, according to an embodiment, the connecting elements 27 with clearance have a substantially circular section with diameter D and the respective seats 28 have an elongated section with smaller size A1 corresponding to such diameter D and a larger size A2 equivalent to D+2G4, as indicated in the figure. Thus, this allows the movement of the connecting elements 27 with clearance within the corresponding seats 28 only along the aligning directions X1-X1, X2-X2, X3-X3, only up to the narrowing of the respective seat 28 to a dimension equivalent to the diameter of the connecting element 27.

This configuration allows an accurate assembly of the supporting plate 23 on the interface plate 25 and guarantees the maintenance of the aligning even during the working at high temperatures, in particular in presence of thermal expansions of the supporting plate 23.

Obviously, there can be provided for a plurality of connecting elements 27 with clearance, in particular more than three, distributed according to the radial development of the aligning directions thereof, the corresponding seats having clearance along such directions alone.

Actually, it should be observed that, contrary to the known cards which comprise probe heads placed on the support through supporting plates, which thus cannot be released from the probe heads or interface cards that guarantee the stiffening thereof, the probe card 20 according to the disclosure comprises an interface plate 25 completely released from the supporting plate 23 due to the use of connecting elements 27 with clearance being housed in a floating manner within the seats 28 of the support. The suitable arrangement of the connecting elements 27 with clearance, as illustrated for example in FIG. 4, guarantees the aligning of the probe head 21 even in the presence of vibrations due to the mechanical movement of the prober system, preventing any movements that are not expansions of the card.

It should be observed that the probe card 20 also contacts pushing elements 30 of the test apparatus (not illustrated) which are adapted to push the supporting plate 23, which presses the connecting elements 27, which in turn end up in contacting the support 26. In particular, the pushing elements are obtained through the so-called pogo towers, provided with a plurality of needles or pogoes pin that directly lie on the supporting plate 23, indicated with 30A in figure.

The presence of the pushing elements 30, particularly, allows to drastically reduce and even eliminate the movement of the probe head 21 in the direction Z, normal to the plane π indicated in FIG. 4.

During the working, when the supporting plate 23 is placed on the support 26, the shoulder 27A of the connecting element 27 with clearance is in a pressure contact on the shoulder 28A of the seat 28, as schematically illustrated in the enlargement of FIG. 3B. In this case, the third clearance G3 is nullified and the space 29 widens up to a thickness having dimensions equivalent to the sum of the initial thickness Tk and the third clearance G3.

It should be observed that in working condition, even in case of elimination of the third clearance G3, there is however a space between the supporting plate 23 and the support 26 since the further clearance G4 is greater than the third clearance G3, the supporting plate 23 being kept in position by the pushing elements 30 too. Actually, this space, guaranteed by the further clearance G4, allows the probe card 20 to continue working correctly even in case of dimensional changes of its constituting elements, for example for a thermal expansion thereof.

In conclusion, advantageously according to the disclosure, there is obtained a probe card capable of correctly working, also in case of working temperatures that imply a thermal expansion of the elements it is made of, thus overcoming the drawbacks of the cards being currently available in the market.

The use of connecting elements housed with clearance in suitable seats, the supporting plate may expand following the increase of the working temperature of the probe card without inducing the movement of the probe head, so as to guarantee the correct working of the probe card under high temperatures working conditions which affect the good working of the known cards.

Advantageously, according to the disclosure, the positioning of the supporting plate is not affected by the thermal expansion of the interface plate, if any, which is not fixedly constrained to the supporting plate.

In particular, the configuration of the probe card prevents the bending of the supporting plate, due to a temperature gradient therein, in case of different temperatures between the wafer and the test apparatus that surround it, which is compensated by the floating coupling obtained by the connecting elements, thus reducing the risks of breaking the supporting plate, also due to the space between the supporting plate and the connecting portions of the interface plate.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A probe card for a testing apparatus for testing electronic devices, comprising:
   a probe head,
   a plurality of contact probes housed within the probe head, each contact probe having at least one contact tip suitable to abut against a contact pad of a device to be tested,
   a supporting plate configured to support the probe head,
   an interface plate,
   a stiffener associated with the supporting plate and the interface plate,
   a plurality of connecting elements with clearance disposed between the supporting plate and the interface plate and housed in a floating manner in a plurality of respective seats made in the supporting plate, each connecting element with clearance having at least a portion that extends into, and is at least partially spaced apart from, the respective seat made in the supporting plate, and
   a plurality of connecting elements without clearance disposed between the interface plate and the stiffener.

2. The probe card of claim 1, wherein:
   each connecting element with clearance comprises: a body and a head portion connected to each other, the head portion having at least one transverse dimension greater than a transverse dimension of the body so as to form a shoulder in a conformation with a substantially T-section, and
   each seat has a configuration corresponding and mating with the respective connecting element with clearance and respective larger dimensions to allow the seat to house in a floating manner the respective connecting element with clearance.

3. The probe card of claim 1, wherein:
   each connecting element with clearance has a body and a head portion connected to each other, the head portion having at least one transverse dimension greater than a transverse dimension of the body so as to form a shoulder in a conformation with a substantially T-section; and
   each seat comprises: a body and a head portion having dimensions greater by at least 10% compared to the body and head portion, respectively, of the respective connecting element with clearance.

4. The probe card of claim 3, wherein:
   a first clearance is defined between the bodies of the connecting element with clearance and the respective seat,
   a second clearance is defined between the head portions of the connecting element with clearance and the respective seat, and
   a third clearance is defined between the shoulders of the connecting element with clearance and the respective seat.

5. The probe card of claim 4, wherein the first clearance has a substantially zero value in a transverse direction and a further clearance is defined between the head portions of the connecting element with clearance and the respective seat in correspondence with a face of the supporting plate facing a support of the probe card as a whole, the further clearance having a greater value than the third clearance.

6. The probe card of claim 5, wherein a space having a predetermined thickness is defined between the interface plate and a further face of the supporting plate.

7. The probe card of claim 1, wherein the connecting elements with clearance are arranged according to radially disposed alignment directions, and have respective positive clearances with the respective seats only along the alignment directions, a substantially zero clearance being established in respective transverse directions that are transverse to the respective alignment directions.

8. The probe card of claim 7, wherein the plurality of connecting elements with clearance includes at least three connecting elements with clearance arranged with alignment directions separated from each other by an angle $\alpha$ equal to 360° divided by the number of connecting elements with clearance.

9. The probe card of claim 1, wherein the interface plate comprises contact portions coupled with the supporting plate by respective connecting elements with clearance of the plurality of connecting elements with clearance.

10. The probe card of claim 9, wherein the interface plate includes further contact portions coupled with the stiffener by respective connecting elements without clearance of the plurality of connecting elements without clearance.

11. The probe card of claim 10, further comprising further connection elements without clearance connected between the probe head and the stiffener.

12. The probe card of claim 1, wherein the interface plate comprises first discrete contact portions respectively coupled with the supporting plate by the connecting elements with clearance.

13. The probe card of claim 12, wherein the interface plate comprises a further contact portion between the probe head and the stiffener, the further contact portion being coupled with the stiffener and probe head by respective connecting elements without clearance.

14. The probe card of claim 1, wherein the connecting elements with clearance are made with a material having a low coefficient of thermal expansion compared to a material that realizes the supporting plate.

15. The probe card according to claim 1, wherein:
each connecting element with clearance comprises a body and a head portion connected to each other, the head portion having at least one transverse dimension greater than a transverse dimension of the body so as to form a shoulder in a conformation with a substantially T-section, and
the head portions of the connecting elements with clearance protrude from the supporting plate so as to go in direct contact against a support on which the probe card is positioned.

16. A probe card apparatus comprising:
a probe head housing a plurality of contact probes, each contact probe having at least one contact tip suitable to abut against a contact pad of a device to be tested,
a supporting plate configured to support the probe head,
an interface plate,
a stiffener associated with the supporting plate and the interface plate,
a plurality of connecting elements with clearance disposed between the supporting plate and the interface plate and housed in a floating manner in a plurality of respective seats made in the supporting plate, each connecting element with clearance having at least a portion that extends into, and is at least partially spaced apart from, the respective seat made in the supporting plate, and
a plurality of connecting elements without clearance disposed between the interface plate and the stiffener, the connecting elements with clearance being made with a material having a low coefficient of thermal expansion compared to a material that realizes the supporting plate.

17. The probe card apparatus of claim 16, wherein:
each connecting element with clearance comprises: a body and a head portion connected to each other, the head portion having at least one transverse dimension greater than a transverse dimension of the body so as to form a shoulder in a conformation with a substantially T-section, and
each seat has a configuration corresponding and mating with the respective connecting element with clearance and respective larger dimensions to allow the seat to house in a floating manner the respective connecting element with clearance.

18. The probe card apparatus of claim 17, wherein:
a first clearance is defined between the bodies of the connecting element with clearance and the respective seat,
a second clearance is defined between the head portions of the connecting element with clearance and the respective seat, and
a third clearance is defined between the shoulders of the connecting element with clearance and the respective seat.

19. The probe card apparatus of claim 18, wherein the first clearance has a substantially zero value in a transverse direction and a further clearance is defined between the head portions of the connecting element with clearance and the respective seat in correspondence with a face of the supporting plate facing a support of the probe card as a whole, the further clearance having a greater value than the third clearance.

20. The probe card apparatus of claim 16, wherein the connecting elements with clearance are arranged according to radially disposed alignment directions, and have respective positive clearances with the respective seats only along the alignment directions, a substantially zero clearance being established in respective transverse directions that are transverse to the respective alignment directions.

21. The probe card apparatus of claim 16, wherein the interface plate comprises first discrete contact portions respectively coupled with the supporting plate by the connecting elements with clearance.

22. The probe card apparatus of claim 21, wherein the interface plate comprises a further contact portion between the probe head and the stiffener, the further contact portion being coupled with the stiffener and probe head by respective connecting elements without clearance.

23. The probe card apparatus according to claim 16, wherein
each connecting element with clearance comprises a body and a head portion connected to each other, the head portion having at least one transverse dimension greater than a transverse dimension of the body so as to form a shoulder in a conformation with a substantially T-section, and
the head portions of the connecting elements with clearance protrude from the supporting plate so as to go in direct contact against a support on which the probe card apparatus is positioned.

24. A testing apparatus comprising:
a device to be tested having a plurality of contact pads,
a probe head housing a plurality of contact probes having respective contact tips suitable to abut against the contact pads of the device to be tested, a supporting plate configured to support the probe head which is coupled to an interface plate by a stiffener, a plurality of connecting elements with clearance disposed between the supporting plate and the interface plate and housed in a floating manner in a plurality of respective seats made in the supporting plate, each connecting element with clearance having at least a portion that extends into, and is at least partially spaced apart from, the respective seat made in the supporting plate, and a plurality of connecting elements without clearance disposed between the interface plate and the stiffener.

25. The testing apparatus of claim 24, wherein:

each connecting element with clearance comprises: a body and a head portion connected to each other, the head portion having at least one transverse dimension greater than a transverse dimension of the body so as to form a shoulder in a conformation with a substantially T-section, and each seat has a configuration corresponding and mating with the respective connecting element with clearance and respective larger dimensions to allow the seat to house in a floating manner the respective connecting element with clearance.

26. The testing apparatus of claim 24, wherein:

a first clearance is defined between the bodies of the connecting element with clearance and the respective seat, a second clearance is defined between the head portions of the connecting element with clearance and the respective seat, and a third clearance is defined between the shoulders of the connecting element with clearance and the respective seat.

27. The testing apparatus of claim 26, wherein the first clearance has a substantially zero value in a transverse direction and a further clearance is defined between the head portions of the connecting element with clearance and the respective seat in correspondence with a face of the supporting plate facing a support of the probe card as a whole, the further clearance having a greater value than the third clearance.

28. The testing apparatus of claim 24, wherein the connecting elements with clearance are arranged according to radially disposed alignment directions, and have respective positive clearances with the respective seats only along the alignment directions, a substantially zero clearance being established in respective transverse directions that are transverse to the respective alignment directions.

29. The testing apparatus of claim 24, wherein the interface plate comprises contact portions coupled with the supporting plate by respective connecting elements with clearance of the plurality of connecting elements with clearance.

30. The testing apparatus of claim 29, wherein the interface plate includes further contact portions coupled with the stiffener by respective connecting elements without clearance of the plurality of connecting elements without clearance.

31. The testing apparatus of claim 24, wherein the interface plate comprises first discrete contact portions respectively coupled with the supporting plate by the connecting elements with clearance.

32. The testing apparatus of claim 31, wherein the interface plate comprises a further contact portion between the probe head and the stiffener, the further contact portion being coupled with the stiffener and probe head by respective connecting elements without clearance.

33. The testing apparatus of claim 24, wherein the connecting elements with clearance are made with a material having a low coefficient of thermal expansion compared to a material that realizes the supporting plate.

34. The testing apparatus according to claim 24, wherein:

each connecting element with clearance comprises a body and a head portion connected to each other, the head portion having at least one transverse dimension greater than a transverse dimension of the body so as to form a shoulder in a conformation with a substantially T-section, and the head portions of the connecting elements with clearance protrude from the supporting plate so as to go in direct contact against a support on which the testing apparatus is positioned.

* * * * *